United States Patent
Yuan et al.

(10) Patent No.: US 9,953,885 B2
(45) Date of Patent: Apr. 24, 2018

(54) STI SHAPE NEAR FIN BOTTOM OF SI FIN IN BULK FINFET

(75) Inventors: Feng Yuan, Hsin-Chu (TW);
Tsung-Lin Lee, Hsin-Chu (TW);
Hung-Ming Chen, Hsin-Chu (TW);
Chang-Yun Chang, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 234 days.

(21) Appl. No.: 12/843,693

(22) Filed: Jul. 26, 2010

(65) Prior Publication Data

US 2011/0097889 A1 Apr. 28, 2011

Related U.S. Application Data

(60) Provisional application No. 61/255,365, filed on Oct. 27, 2009.

(51) Int. Cl.
| | | |
|---|---|---|
| H01L 21/76 | (2006.01) | |
| H01L 21/84 | (2006.01) | |
| H01L 21/762 | (2006.01) | |
| H01L 21/8234 | (2006.01) | |
| H01L 29/66 | (2006.01) | |

(52) U.S. Cl.
CPC ...... *H01L 21/845* (2013.01); *H01L 21/76224* (2013.01); *H01L 21/823431* (2013.01); *H01L 29/66795* (2013.01)

(58) Field of Classification Search
USPC .... 438/700, 778, 694; 257/E21.546, E21.24, 257/330, 332
See application file for complete search history.

(56) References Cited

U.S. PATENT DOCUMENTS

| | | | | |
|---|---|---|---|---|
| 5,763,315 A | | 6/1998 | Benedict et al. | |
| 6,159,801 A | * | 12/2000 | Hsieh | H01L 27/115 257/330 |
| 6,268,629 B1 | * | 7/2001 | Noguchi | H01L 21/76232 257/345 |
| 6,352,897 B1 | * | 3/2002 | Sung | H01L 21/76232 257/E21.549 |
| 6,399,985 B2 | * | 6/2002 | Horita | H01L 21/26586 257/330 |
| 6,465,866 B2 | * | 10/2002 | Park et al. | 257/510 |

(Continued)

FOREIGN PATENT DOCUMENTS

| | | |
|---|---|---|
| JP | 2002118255 | 4/2002 |
| JP | 2005510080 | 4/2005 |

(Continued)

*Primary Examiner* — Bradley K Smith
*Assistant Examiner* — David Goodwin
(74) *Attorney, Agent, or Firm* — Slater Matsil, LLP

(57) ABSTRACT

A method of forming an integrated circuit structure includes providing a semiconductor substrate including a top surface; forming a first insulation region and a second insulation region in the semiconductor substrate; and recessing the first insulation region and the second insulation region. Top surfaces of remaining portions of the first insulation region and the second insulation region are flat surfaces or divot surfaces. A portion of the semiconductor substrate between and adjoining removed portions of the first insulation region and the second insulation region forms a fin.

20 Claims, 6 Drawing Sheets

(56) References Cited

U.S. PATENT DOCUMENTS

| | | | |
|---|---|---|---|
| 6,479,369 B1 * | 11/2002 | Miyoshi | 438/435 |
| 6,541,351 B1 | 4/2003 | Bartlau et al. | |
| 6,706,571 B1 | 3/2004 | Yu et al. | |
| 6,858,478 B2 | 2/2005 | Chau et al. | |
| 6,867,086 B1 | 3/2005 | Chen et al. | |
| 6,893,937 B1 * | 5/2005 | Gu | H01L 21/76224 257/E21.507 |
| 6,949,447 B2 * | 9/2005 | Ahn | H01L 21/76224 257/E21.546 |
| 7,033,945 B2 * | 4/2006 | Byun et al. | 438/700 |
| 7,190,050 B2 | 3/2007 | King et al. | |
| 7,247,887 B2 | 7/2007 | King et al. | |
| 7,265,008 B2 | 9/2007 | King et al. | |
| 7,276,757 B2 * | 10/2007 | Kamo | H01L 21/76224 257/315 |
| 7,358,142 B2 * | 4/2008 | Kang et al. | 438/283 |
| 7,358,145 B2 | 4/2008 | Yang | |
| 7,508,031 B2 | 3/2009 | Liu et al. | |
| 7,528,465 B2 | 5/2009 | King et al. | |
| 7,535,061 B2 | 5/2009 | Lee et al. | |
| 7,588,985 B2 | 9/2009 | Kim | |
| 7,605,449 B2 | 10/2009 | Liu et al. | |
| 7,674,685 B2 | 3/2010 | Choi et al. | |
| 7,843,000 B2 * | 11/2010 | Yu et al. | 257/330 |
| 7,915,693 B2 | 3/2011 | Okano | |
| 8,058,179 B1 * | 11/2011 | Draeger et al. | 438/714 |
| 2002/0072198 A1 * | 6/2002 | Ahn | H01L 21/76224 438/424 |
| 2003/0013271 A1 | 1/2003 | Knorr et al. | |
| 2003/0143817 A1 | 7/2003 | Ho et al. | |
| 2003/0143852 A1 | 7/2003 | En-Ho et al. | |
| 2004/0126990 A1 | 7/2004 | Ohta | |
| 2004/0144749 A1 | 7/2004 | Kim et al. | |
| 2005/0153490 A1 | 7/2005 | Yoon et al. | |
| 2007/0120156 A1 | 5/2007 | Liu et al. | |
| 2007/0122953 A1 | 5/2007 | Liu et al. | |
| 2007/0122954 A1 | 5/2007 | Liu et al. | |
| 2007/0128782 A1 | 6/2007 | Liu et al. | |
| 2007/0132053 A1 | 6/2007 | King et al. | |
| 2007/0134884 A1 | 6/2007 | Kim et al. | |
| 2008/0217702 A1 | 9/2008 | Oishi | |
| 2008/0290470 A1 | 11/2008 | King et al. | |
| 2008/0296632 A1 | 12/2008 | Moroz et al. | |
| 2008/0315267 A1 | 12/2008 | Hampp et al. | |
| 2009/0127648 A1 | 5/2009 | Chen et al. | |
| 2009/0170321 A1 * | 7/2009 | Cho et al. | 438/692 |
| 2009/0181477 A1 | 7/2009 | King et al. | |
| 2009/0250769 A1 | 10/2009 | Yu et al. | |
| 2010/0078757 A1 | 4/2010 | Eun | |
| 2010/0099236 A1 * | 4/2010 | Kwon et al. | 438/435 |
| 2010/0129982 A1 * | 5/2010 | Kao | H01L 27/11521 438/430 |
| 2010/0190345 A1 * | 7/2010 | Chen et al. | 438/700 |
| 2010/0230757 A1 | 9/2010 | Chen et al. | |
| 2011/0008969 A1 | 1/2011 | Bencher et al. | |

FOREIGN PATENT DOCUMENTS

| | | |
|---|---|---|
| JP | 2009004769 | 1/2009 |
| JP | 2009032955 | 2/2009 |

* cited by examiner

STI SHAPE NEAR FIN BOTTOM OF SI FIN IN BULK FINFET

This application claims the benefit of U.S. Provisional Application No. 61/255,365 filed on Oct. 27, 2009, entitled "STI Shape Near Fin Bottom of Si Fin in Bulk FinFET," which application is hereby incorporated herein by reference.

CROSS-REFERENCE TO RELATED APPLICATION

This application relates to the following U.S. patent application: Application Ser. No. 61/160,635, filed Mar. 16, 2009, and entitled "Hybrid STI Gap-Filling Approach," which application is hereby incorporated herein by reference.

TECHNICAL FIELD

This application relates generally to integrated circuits, and more particularly to structures and manufacturing methods of and semiconductor fins and Fin field effect transistors (FinFETs).

BACKGROUND

With the increasing down-scaling of integrated circuits and increasingly demanding requirements to the speed of integrated circuits, transistors need to have higher drive currents with increasingly smaller dimensions. Fin field-effect transistors (FinFET) were thus developed. FIG. 1 illustrate a cross-sectional view of a conventional FinFET, wherein the cross-sectional view is made crossing the fins rather than the source and drain regions. Fins 100 are formed as vertical silicon fins extending above substrate 102, and are used to form source and drain regions (not shown) and channel regions therebetween. Shallow trench isolation (STI) regions 120 are formed to define fins 100. Gate 108 is formed over fins 100. Gate dielectric 106 is formed to separate fins 100 from gate 108.

In the formation of STI regions 120, a wet etch is used to recess the top surfaces of STI regions 120 to form fins 100. It is observed that with the wet etching, the center portions of the surfaces of STI regions 120 are lower than the portions of surfaces close to fins 100. The top surfaces of STI regions 120 are referred to as having a smiling profile.

It is realized that the parasitic capacitance (shown as capacitors 110) is generated between gate 108 and semiconductor strips 122, wherein STI regions 120 act as the insulator of parasitic capacitor 110. The parasitic capacitance adversely affects the performance of the respective integrated circuit, and needs to be reduced.

SUMMARY

In accordance with one aspect of the embodiment, a method of forming an integrated circuit structure includes providing a semiconductor substrate including a top surface; forming a first insulation region and a second insulation region in the semiconductor substrate; and recessing the first insulation region and the second insulation region. Top surfaces of remaining portions of the first insulation region and the second insulation region are flat surfaces or divot surfaces. A portion of the semiconductor substrate between and adjoining removed portions of the first insulation region and the second insulation region forms a fin.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

A novel method for forming shallow trench isolation (STI) regions and a fin field-effect transistor (FinFET) is provided. The intermediate stages in the manufacturing of an embodiment are illustrated. The variations of the embodiment are discussed. Throughout the various views and illustrative embodiments, like reference numbers are used to designate like elements.

Figure 1:
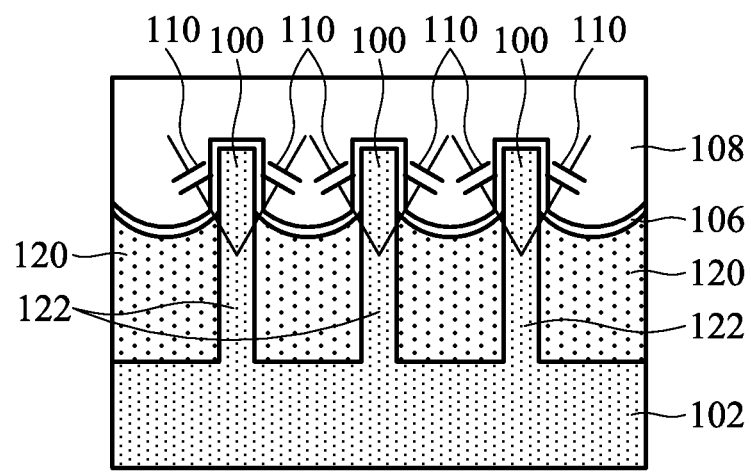
FIG. 1 illustrates a cross-sectional view of a conventional FinFET.
Figure 2:
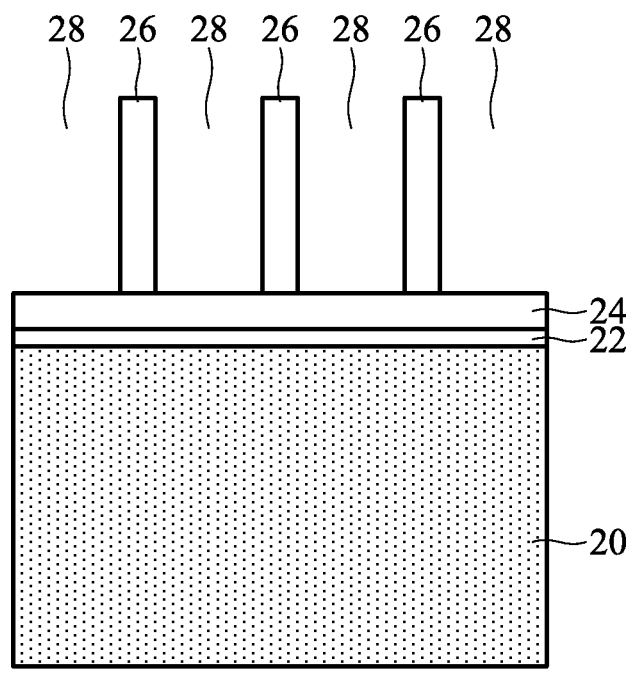
FIGS. 2 through 8C are cross-sectional views of intermediate stages in the manufacturing of a FinFET in accordance with an embodiment.

Referring to FIG. 2, semiconductor substrate 20 is provided. In an embodiment, semiconductor substrate 20 includes silicon. Other commonly used materials, such as carbon, germanium, gallium, arsenic, nitrogen, indium, and/or phosphorus, and the like, may also be included in semiconductor substrate 20. Semiconductor substrate 20 may be a bulk substrate or a semiconductor-on-insulator (SOI) substrate.

Pad layer 22 and mask layer 24 may be formed on semiconductor substrate 20. Pad layer 22 may be a thin film comprising silicon oxide formed, for example, using a thermal oxidation process. Pad layer 22 may act as an adhesion layer between semiconductor substrate 20 and mask layer 24. Pad layer 22 may also act as an etch stop layer for etching mask layer 24. In an embodiment, mask layer 24 is formed of silicon nitride, for example, using low-pressure chemical vapor deposition (LPCVD). In other embodiments, mask layer 24 is formed by thermal nitridation of silicon, plasma enhanced chemical vapor deposition (PECVD), or plasma anodic nitridation. Mask layer 24 is used as a hard mask during subsequent photolithography processes. Photo resist 26 is formed on mask layer 24 and is then patterned, forming openings 28 in photo resist 26.

Figure 3:
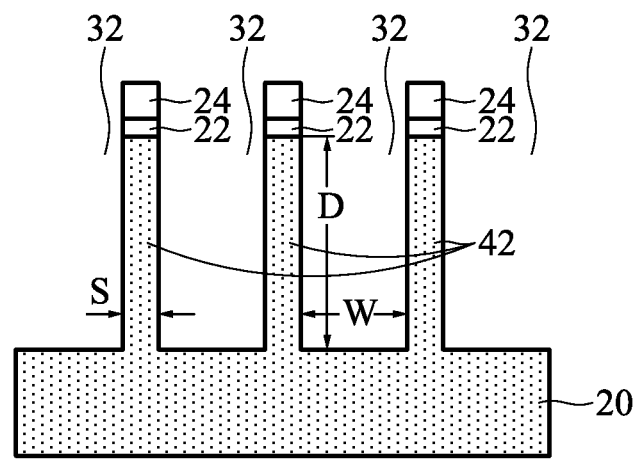

Referring to FIG. 3, mask layer 24 and pad layer 22 are etched through openings 28, exposing underlying semiconductor substrate 20. The exposed semiconductor substrate 20 is then etched, forming trenches 32. The portions of semiconductor substrate 20 between trenches 32 form semiconductor strips 42. Trenches 32 may be strips (in the top view) parallel to each other, and closely located from each other. For example, the spacing S between trenches 32 may be smaller than about 30 nm. Photo resist 26 is then removed. Next, a cleaning may be performed to remove a native oxide of semiconductor substrate 20. The cleaning may be performed using diluted hydrofluoric (HF) acid.

Depth D of trenches 32 may be between about 2100 Å and about 2500 Å, while width W is between about 300 Å and about 1500 Å. In an exemplary embodiment, the aspect ratio (D/W) of trenches 32 is greater than about 7.0. In other exemplary embodiments, the aspect ratio may even be greater than about 8.0, although they may also be lower than about 7.0, or between 7.0 and 8.0. One skilled in the art will realize, however, that the dimensions and values recited throughout the descriptions are merely examples, and may be changed to suit different scales of integrated circuits.

Figure 4:
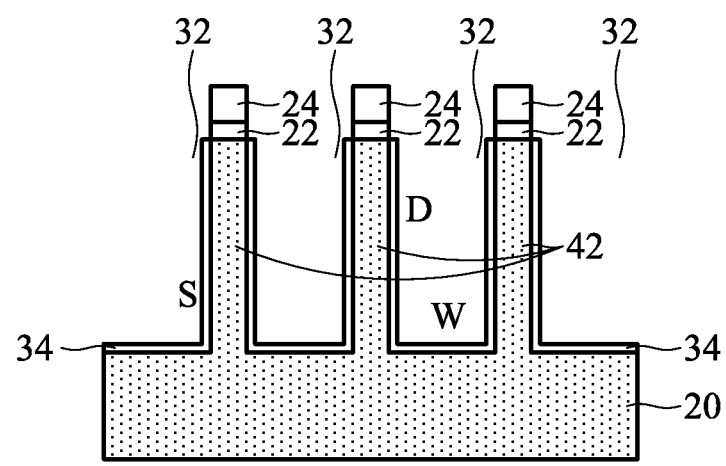

Liner oxide 34 is then formed in trenches 32, as is shown in FIG. 4. In an embodiment, liner oxide 34 may be a thermal oxide having a thickness between about 20 Å to about 500 Å. In other embodiments, liner oxide 34 may be formed using in-situ steam generation (ISSG). In yet other embodiments, liner oxide 34 may be formed using a deposition technique that can form conformal oxide layers, such as selective area chemical vapor deposition (SACVD) and the like. The formation of liner oxide 34 rounds the corners of trenches 32, which reduces the electrical fields, and hence improves the performance of the resulting integrated circuit.

Figure 5:
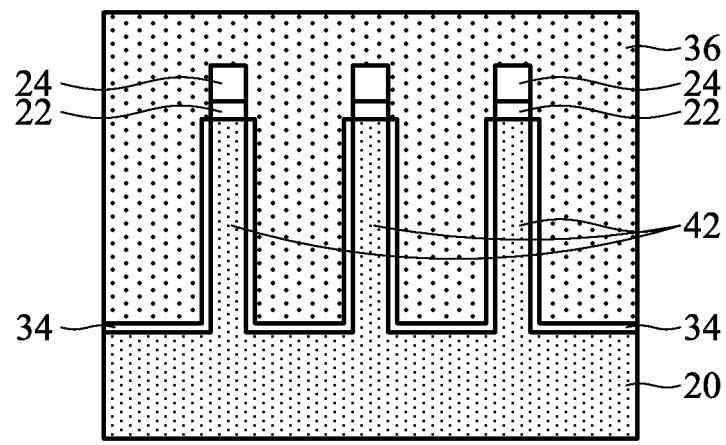

Referring to FIG. 5, trenches 32 are filled with dielectric material 36. Dielectric material 36 may include silicon oxide, and hence is referred to as oxide 36, although other dielectric materials, such as SiN, SiC, or the like, may also be used. In an embodiment, oxide 36 is formed using a high aspect-ratio process (HARP), wherein process gases may include tetraethylorthosilicate (TEOS) and $O_3$ (ozone).

Figure 6:
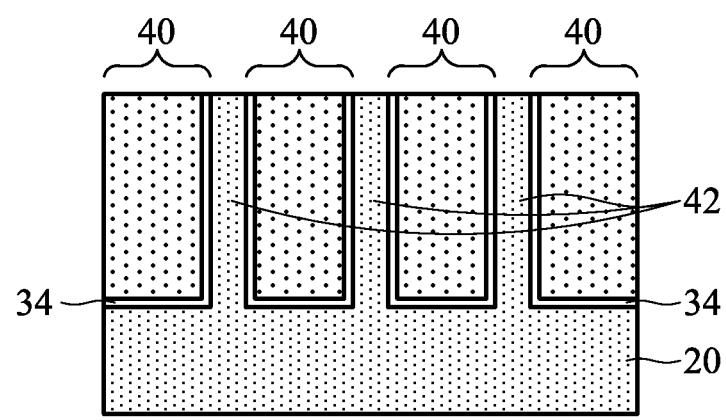

A chemical mechanical polish is then performed, followed by the removal of mask layer 24 and pad layer 22. The resulting structure is shown in FIG. 6. The remaining portions of oxide 36 and liner oxide 34 in trenches 32 are referred to as shallow trench isolation (STI) regions 40 hereinafter. Mask layer 24, if formed of silicon nitride, may be removed by a wet process using hot $H_3PO_4$, while pad layer 22 may be removed using diluted HF acid, if formed of silicon oxide. In alternative embodiments, the removal of mask layer 24 and pad layer 22 may be performed after the recessing of STI regions 40, which recessing step is shown in FIGS. 7A through 7C.

Next, the structure shown in FIG. 6 may be used to form fins of a FinFET. As shown in FIGS. 7A, 7B, and 7C, STI regions 40 are recessed by an etching step, resulting in recess 52. The portions of semiconductor strips 42 protruding over the top surfaces of the remaining STI regions 40 thus become fins 60. Height H' of fins 60 may be between 15 nm and about 50 nm, although it may also be greater or smaller.

Figure 7A:
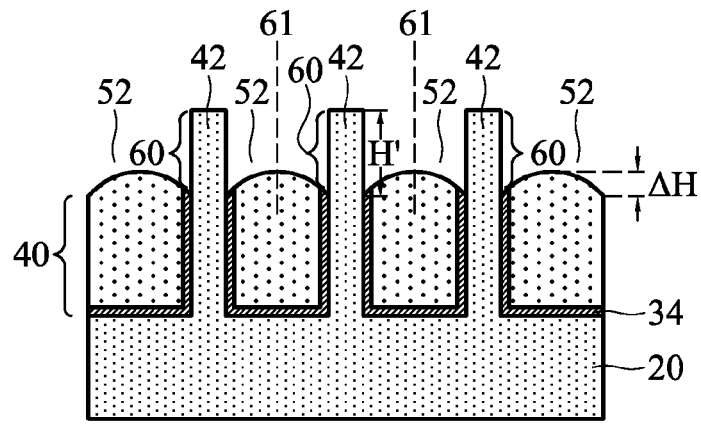
Figure 7B:
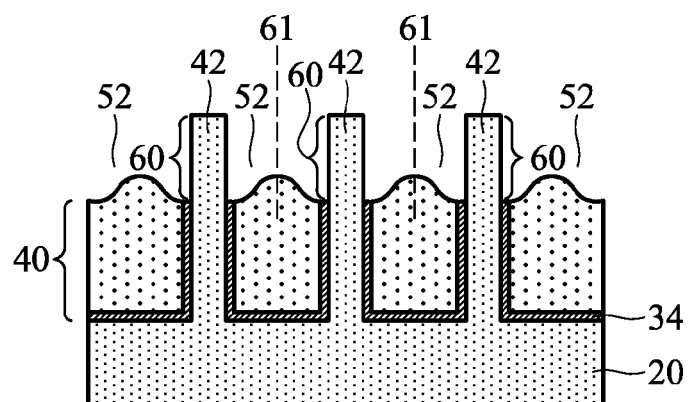
Figure 7C:
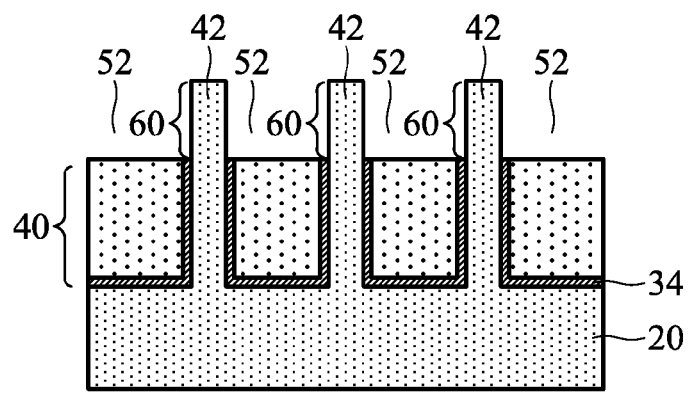

The top surfaces of STI regions 40 in FIGS. 7A, 7B, and 7C have different profiles. The STI regions 40 in FIGS. 7A and 7B are referred to as having divot profiles. Accordingly, the respective STI regions 40 in FIGS. 7A and 7B are referred to as divot STI regions. It is observed that the space between neighboring fins 60 have middle lines 61, and the portions of the top surfaces of STI regions 40 close to middle lines 61 are higher than the portions of the top surfaces close to fins 60. In other words, the centers of the top surfaces of the divot STI regions 40 may be the highest, and from middle lines 61 to respective fins 60, the top surfaces of STI regions 40 are gradually, and may be continuously, lowered. In an embodiment, as shown in FIG. 7A, the highest point and the lowest point of the top surface of an STI region 40 have a height different ΔH greater than about 5 nm, or even greater than about 20 nm. The gradual decrease in the height of the top surfaces of STI regions 40 may continue all the way from middle line 61 to the adjoining fin 60, as shown in FIG. 7A. Alternatively, the top surfaces of STI regions 40 may rise slightly where they join fins 60, as shown in FIG. 7B. However, the highest points of the top surfaces of STI regions 40 are still close to middle lines 61. FIG. 7C illustrates an alternative embodiment, wherein the top surfaces of STI regions 40 are substantially flat. Accordingly, the respective STI regions 40 are referred to as flat STI regions.

In order to form STI regions 40 having the profiles as shown in FIGS. 7A, 7B, and 7C, a dry etch may be performed. In an embodiment, the etch is performed using a Siconi (also referred to as SiCoNi) process, in which the process gases include $NH_3$, HF, and the like. In an embodiment, the flow rate of NH3 is about 10 sccm and about 1000 sccm, and the flow rate of HF is about 100 sccm and about 500 sccm. HF and $NH_3$ react with silicon oxide in STI regions 40 to form $(NH_4)_2SiF_6$, which accumulates on STI regions 40 to block further HF/$NH_3$ from reaching silicon oxide. Accordingly, the etching rate is reduced, the lateral etching is strengthened, and flat STI regions 40 or divot STI regions 40 may be formed.

Figure 8A:
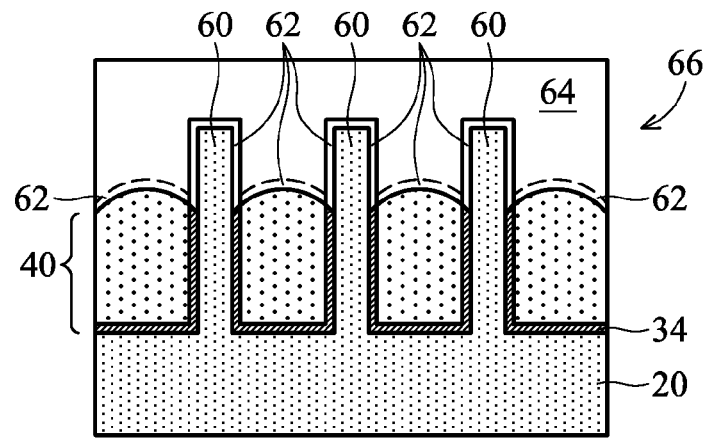
Figure 8B:
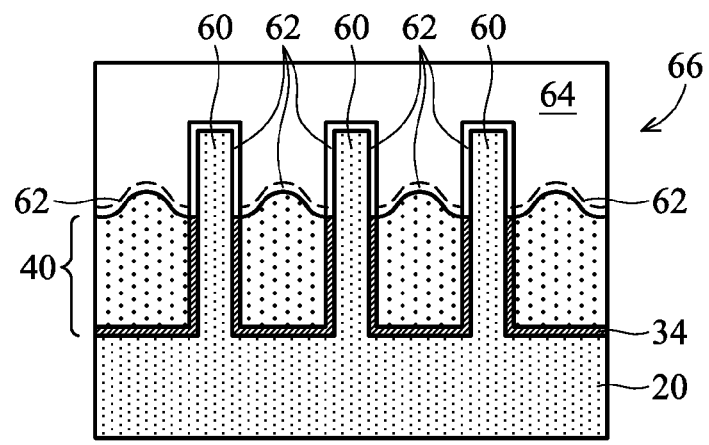
Figure 8C:
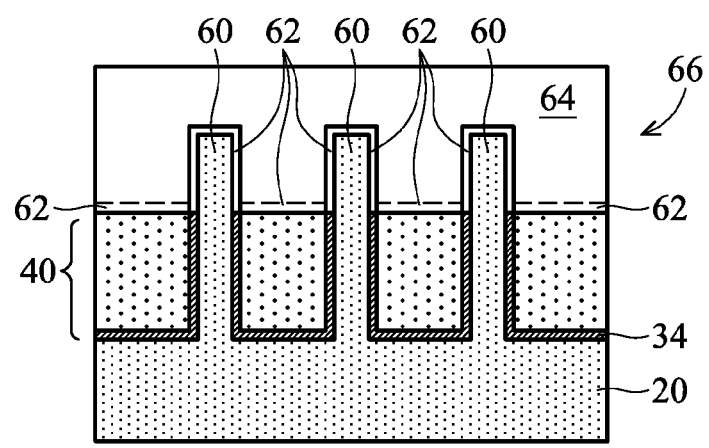

FIGS. 8A, 8B, and 8C illustrate the FinFETs formed from the structures shown in FIGS. 7A, 7B, and 7C, respectively. In, each of FIGS. 8A, 8B, and 8C, gate dielectric 62 is formed to cover the top surfaces and sidewalls of fins 60. Gate dielectric 62 may be formed by a thermal oxidation, and hence may include thermal silicon oxide. In this embodiment, gate dielectric 62 is formed on the top surfaces of fins 60, but not on the main parts of top surfaces of STI regions 40. Alternatively, Gate dielectric 62 may be formed by a deposition, and may be formed of high-k materials. Accordingly, gate dielectric 62 is formed on the top surfaces of fins 60 and the top surfaces of STI regions 40 (the portions shown with dotted lines). The portions of gate dielectric 62 directly over the top surfaces of STI regions 40 will thus also have a divot profile. Gate electrode 64 is then formed on gate dielectric 62. In an embodiment, gate electrode 64 covers more than one fin 60, so that the resulting FinFET 66 comprises more than one fin 60. In alternative embodiments, each of fins 60 may be used to form one FinFET. The remaining components of the FinFET, including source and drain regions and source and drain silicides (not shown), are then formed. The formation processes of these components are known in the art, and hence are not repeated herein.

Figure 9A:
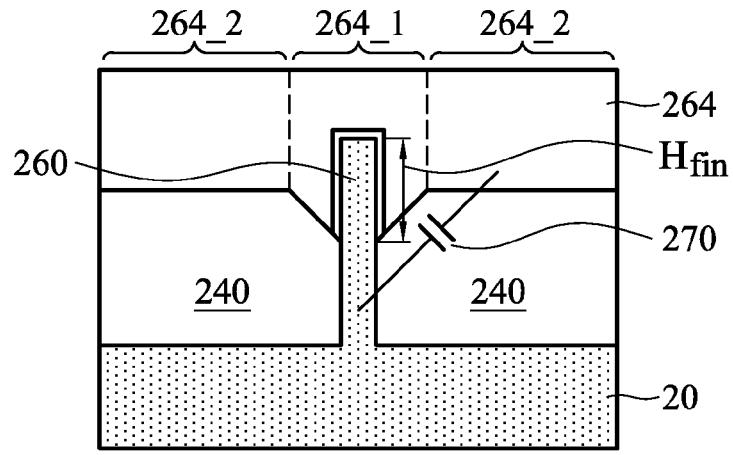
FIGS. 9A through 9C are structures used for performing simulations.
Figure 9B:
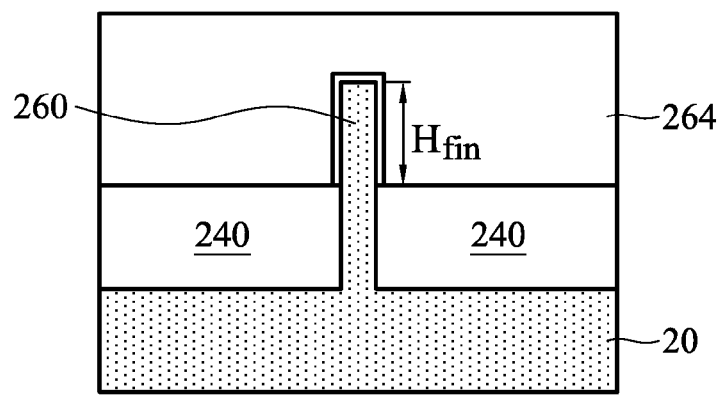
Figure 9C:
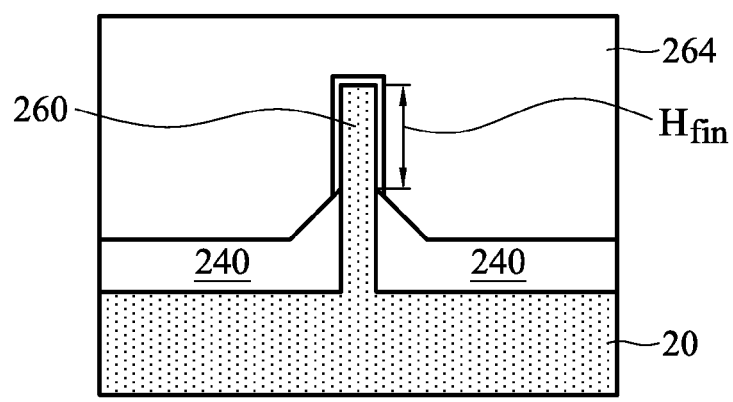

Simulations were performed to study the effects of the profiles of STI regions 240. FIGS. 9A, 9B, and 9C are the structures on which simulations are performed, and comprise divot STI regions 240, flat STI regions 240, and smiling STI regions 240, respectively. The structures in FIGS. 9A, 9B, and 9C have the same fin height $H_{fin}$. The simulation results revealed that the parasitic gate capacitance in FIG. 9A is the smallest, and the parasitic gate capacitance in FIG. 9C is the greatest. With the smallest parasitic gate capacitance, the FinFET in FIG. 9A may have an improved speed over the FinFET shown in FIGS. 9B and 9C. Similarly, the FinFET in FIG. 9B may have an improved speed over the FinFET shown in FIG. 9C. A possible explanation is that (referring to FIG. 9A) gate electrode 264 may be divided into a portion 264_1 that is close to fin 260 and portions 264_2 that are spaced apart from fin 260 by portion 264_1. Gate portion 264_1 contributes to the controlling of the channel in fin 260. Gate portions 264_2, however, not only do not contribute to the controlling of the channel, but also adversely contribute to the parasitic gate capacitance, wherein capacitor 270 symbolizes a portion of the parasitic gate capacitance. Accordingly, with the divot or flat STI regions, the sizes of gate portions 264_2 are reduced. Further, the effective thickness of the capacitor insulator of capacitor 270 is increased. As a result, the gate parasitic capacitance is reduced.

The embodiments have several advantageous features. By forming flat STI regions or divot STI regions underlying gate electrodes of FinFETs, the parasitic gate capacitance of the FinFETs may be reduced, and the speed of the respective FinFETs may be increased.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method of forming an integrated circuit structure, the method comprising:
   forming a plurality of shallow-trench isolation (STI) regions in a silicon substrate, wherein an entire portion of the silicon substrate disposed above bottommost surfaces of the plurality of STI regions comprises a semiconductor material;
   removing top portions of the plurality of STI regions using HF and $NH_3$ as process gases to form a first silicon fin and a second silicon fin, wherein the first silicon fin and the second silicon fin are horizontally between, and above, remaining lower portions of the plurality of STI regions, and wherein one of the plurality of STI regions (an intermediate STI region) is between and contacting the first silicon fin and the second silicon fin and has a divot top surface, with the highest point of a top surface of the intermediate STI region being close to a middle line between the first silicon fin and the second silicon fin, and lower than top surfaces of the first and the second silicon fins, wherein the intermediate STI region comprises:
   a liner contacting the first silicon fin and the second silicon fin; and
   a dielectric region, wherein the liner contacts sidewalls and a bottom of the dielectric region, wherein the highest point of the top surface of the intermediate STI region is the highest point of both the liner and the dielectric region, and wherein the top surface of the intermediate STI region comprises:
   a first region extending from the highest point of the top surface of the intermediate STI region toward a first sidewall of the first silicon fin, wherein magnitudes of slopes of the first region increase as the first region extends from the highest point of the top surface of the intermediate STI region toward the first sidewall of the first silicon fin;
   a second region extending from the first sidewall of the first silicon fin toward the highest point of the top surface of the intermediate STI region, wherein the second region comprises a top surface of a vertical portion of the liner, and wherein the top surface of the vertical portion of the liner rises slightly as the top surface of the vertical portion of the liner extends toward the first sidewall of the first silicon fin; and
   a third region interposed between the first region and the second region, wherein magnitudes of slopes of the third region decrease as the third region extends from the first region toward the second region, and wherein a first direction pointing from the highest point of the top surface of the intermediate STI region toward the first sidewall of the first silicon fin is perpendicular to a current flow direction through the first silicon fin; and
   after removing the top portions of the plurality of STI regions, forming a FinFET comprising:
   forming a gate dielectric on top surfaces and sidewalls of the first silicon fin and the second silicon fin, wherein the gate dielectric extends between the first sidewall of the first silicon fin and a second sidewall of the second silicon fin; and
   forming a gate electrode on the gate dielectric, wherein the gate electrode extends from directly over the first silicon fin to directly over the second silicon fin.

2. The method of claim 1, wherein the plurality of STI regions comprises silicon oxide.

3. The method of claim 1, wherein a lowest point of the top surface of the intermediate STI region is close to, and is not, a joint point of the top surface of the intermediate STI region and the first sidewall of the first silicon fin.

4. The method of claim 1, wherein the highest point and a lowest point of the top surface of the intermediate STI region have a height difference greater than about 5 nm.

5. The method of claim 1, wherein the intermediate STI region is formed by steps comprising:
   forming the liner contacting the first silicon fin and the second silicon fin; and
   filling the dielectric region over a bottom portion of the liner, wherein the gate dielectric contacts the top surface of the vertical portion of the liner.

6. The method of claim 5, wherein the forming the liner comprises a thermal oxidation, and the filling the dielectric region comprises a reaction using tetrathylorthosilicate (TEOS) and ozone as process gases.

7. The method of claim 1, wherein the second region and the third region are portions of a concave region of the top surface of the intermediate STI region.

8. The method of claim 1, wherein the first silicon fin and the second silicon fin have heights between about 15 nm and about 50 nm.

9. A method comprising:
   etching a semiconductor substrate to form a trench extending into the semiconductor substrate, wherein remaining portions of the semiconductor substrate form a first semiconductor strip and a second semiconductor strip on opposite sides of the trench and wherein entireties of the first semiconductor strip and the second semiconductor strip comprise a semiconductor material;
   forming a liner oxide extending to a bottom of the trench and on sidewalls of the first semiconductor strip and the second semiconductor strip;
   filling a dielectric material into the trench and over the liner oxide;

planarizing the dielectric material, wherein the dielectric material and a remaining portion of the liner oxide in combination form a shallow-trench isolation (STI) region;

etching the STI region using HF and NH$_3$ as process gases, wherein a remaining portion of the STI region has a top surface having:
- a convex region including a highest point of the top surface substantially at a middle line between the first semiconductor strip and the second semiconductor strip; and
- a first concave region including a lowest point of the top surface close to a vertical interface between the dielectric material and a vertical portion of the liner oxide, wherein the first concave region is interposed between the vertical interface and the convex region along a first direction pointing from the highest point to the vertical interface, wherein a top surface of the vertical portion of the liner oxide rises slightly from the vertical interface toward the first semiconductor strip along the first direction, and wherein the first direction is perpendicular to a current flow direction through the first semiconductor strip; and after etching the STI region, forming a FinFET comprising:
- forming a gate dielectric on the sidewalls of the first semiconductor strip and the second semiconductor strip, the gate dielectric extending over the bottom of the trench and directly contacting the top surface of the STI region; and
- forming a gate electrode over the gate dielectric, the gate electrode extending above top surfaces of the first semiconductor strip and the second semiconductor strip.

10. The method of claim 9, wherein the forming the STI region comprises forming a silicon oxide region.

11. The method of claim 9, wherein at the lowest point, the top surface is substantially flat.

12. The method of claim 9, wherein the highest point and the lowest point have a height difference greater than about 5 nm.

13. The method of claim 9, wherein the highest point of the top surface of the STI region is the highest point of both the liner oxide and the dielectric material.

14. The method of claim 9, wherein the top surface of the STI region further has a second concave region, the convex region being interposed between the first concave region and the second concave region along the first direction.

15. The method of claim 9, wherein the gate dielectric completely covers the top surface of the STI region.

16. A method comprising:
etching a semiconductor substrate to form a trench extending into the semiconductor substrate, wherein remaining portions of the semiconductor substrate form a first semiconductor strip and a second semiconductor strip on opposite sides of the trench, wherein entireties of the first semiconductor strip and the second semiconductor strip comprise a semiconductor material;

forming a liner oxide extending to a bottom of the trench and on sidewalls of the first semiconductor strip and the second semiconductor strip;

filling a dielectric material into the trench and over the liner oxide;

planarizing the dielectric material, wherein the dielectric material and a remaining portion of the liner oxide in combination form a shallow-trench isolation (STI) region;

etching the STI region using HF and NH$_3$ as process gases, wherein a remaining portion of the STI region has a top surface having a highest point, and the highest point is substantially at a middle line between the first semiconductor strip and the second semiconductor strip, and wherein the top surface comprises:
- a first region including the highest point, the first region having a first curvature; and
- a second region having a second curvature, the second curvature and the first curvature having opposite signs, wherein the second region is interposed between the first semiconductor strip and the first region along a first direction pointing from the highest point to the first semiconductor strip, and wherein the first direction is perpendicular to a current flow direction through the first semiconductor strip; and after etching the STI region, forming a FinFET comprising:
- forming a gate dielectric on sidewalls of the trench, the gate dielectric extending over the bottom of the trench and completely covering the top surface of the STI region; and
- forming a gate electrode over the gate dielectric.

17. The method of claim 16, wherein the top surface of the STI region comprises an edge portion, with the edge portion being a top surface of a vertical portion of the liner oxide, and portions of the edge portion farther away from the dielectric material are increasingly lower than portions of the edge portion closer to the dielectric material.

18. The method of claim 16, wherein the filling the dielectric material comprises a reaction using tetrathylorthosilicate (TEOS) and ozone as process gases.

19. The method of claim 16, wherein a top surface of the gate electrode is over a top surface of the first semiconductor strip and a top surface of the second semiconductor strip.

20. The method of claim 16, wherein the gate dielectric directly contacts the top surface of the STI region.

* * * * *